Oct. 16, 1962 E. I. DOUCETTE ET AL 3,059,158

PROTECTED SEMICONDUCTOR DEVICE AND METHOD OF MAKING IT

Filed Feb. 9, 1959 2 Sheets-Sheet 1

INVENTORS E. I. DOUCETTE
R. M. RYDER
BY
Arthur J. Torsiglieri
ATTORNEY

Oct. 16, 1962 E. I. DOUCETTE ET AL 3,059,158

PROTECTED SEMICONDUCTOR DEVICE AND METHOD OF MAKING IT

Filed Feb. 9, 1959 2 Sheets-Sheet 2

INVENTORS E. I. DOUCETTE
R. M. RYDER
BY
Arthur J. Torsiglieri
ATTORNEY 3,059,158

PROTECTED SEMICONDUCTOR DEVICE AND METHOD OF MAKING IT

Edward I. Doucette and Robert M. Ryder, Summit, N.J., assignors to Bell Telephone Laboratories, Incorporated, New York, N.Y., a corporation of New York Filed Feb. 9, 1959, Ser. No. 791,934
10 Claims. (Cl. 317—234)

This invention relates to semiconductor electrical translating devices, and to methods for making them, and relates particularly to protected semiconductor translating devices and methods for making the same.

Ever since the beginnings of commercial development of semiconductor translating devices such as rectifiers and other diode structures, transistors and other triode devices, and similar electrical components, an important problem has been their stabilization against environmental influences. After manufacture to given specifications, some technique for preserving the initial characteristics of the device against further change has been needed. Since most semi-conducting materials are sensitive to ambient atmospheres, a method of isolating the semiconductor element of a translating device has been sought.

In the prior art, effective results in stabilizing semiconductor elements have been obtained by encapsulation of the elements, that is by sealing them in impermeable containers of metal or glass, or both of these materials, with an artificial protective environment, for the semiconductor element. Such techniques are taught, for example, in the patent to H. Q. North et al., No. 2,694,168, granted November 9, 1954.

The drawback inherent in such structures, generally, is their complexity, leading to high manufacturing costs. It is not unusual for the cost of the processed active semiconductor element in a device to be overshadowed by several hundred percent by the costs of encapsulation of the element. Before sealing such a capsule, many steps of affixing leads through the capsule housing to the semiconductor element, fitting the element into the housing, and getting spatial register of the electrodes and active surface portions of the semiconducting element must precede.

In the present invention, teaching simplified structures, much of the complexity and criticality of assembly, and concomitantly much of the cost of the finished product, is obviated. The new structures and techniques of the invention incorporate the semiconductor element and the electrodes into the protected device in an integral manner, with the element itself acting in part as a protective housing for its own sensitive portions. This feature prompts description of the devices as "self-encapsulated" and of their production as a technique of "self-encapsulation."

A typical embodiment of the invention involves a layered structure of which the semiconductive element, having an exposed p-n junction at one face, forms one of the layers and a lamellate insulating protective member through which extends an electrical connection forms another layer. The semiconductive element and the insulating protective member are joined together such that they define an enclosure for the exposed p-n junction. A number of variations are possible in this basic arrangement.

The kinds of structures contemplated by the invention are exemplified by the selection of devices shown in the accompanying drawings. In the drawings.

Figure 1:
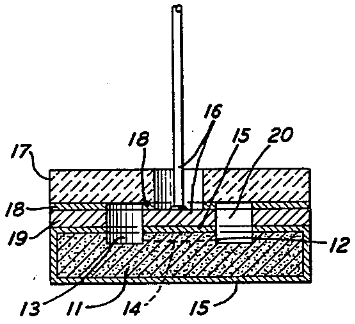
FIG. 1 is a front elevation, in section, of a self-encapsulated semiconductor diode device much enlarged.
Figure 2:
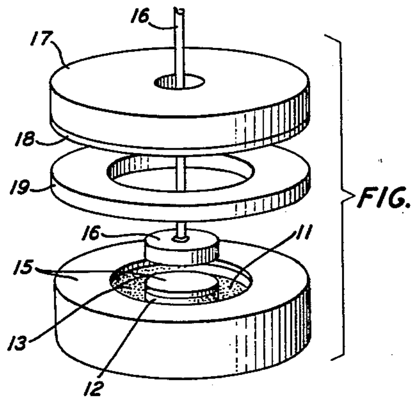
FIG. 2 is an exploded perspective view of the device of FIG. 1 showing its component members.

In FIGS. 1 and 2 is shown a current limiter, a self-encapsulated diode semiconductor device comprising semiconductor element 11, such as of germanium or silicon, conveniently in wafer form. The wafer, consisting predominantly of a single conductivity type material, for example n-type silicon, has raised central portion or "mesa" 12, isolated in part from the remainder of the element 11 by trench or groove 13, etched or cut into the body of the element 11. A portion of mesa 12 has a region of a second conductivity type, in our example p-type silicon, separated from the remainder of the body by a p-n junction 14. Element 11, including mesa 12, but excepting trench 13 and exposed portions of junction 14, is covered with a segmented thin metal film 15, conveniently of gold.

A portion of film 15 makes a low resistance contact to n-type portions of the semiconductor element 11, serving as one electrode for the device of FIG. 1. Second electrode 16, in the form of a metallic nail head and conveniently made of gold, contacts the p-type portion of mesa 12 through that portion of film 15 overlaying mesa 12. Electrode 16 is passed through annular ring 17 of a non-conducting substance, for example steatite ceramic. Ring 17, having thin metallic plating 18 thereon in the form of two concentric rings and again conveniently of gold, is joined to electrode 16 so as to seal the annulus of ring 17. A seal of element 11 to plated ring 17 is made using annular disc 19, conveniently of metallic gold, which is fusible to gold platings 15 and 18 of element 11 and ring 17 respectively. In the structure as assembled, semiconductor element 11 is an integral part of the "capsule" also formed in part by ring 17 and disc 19. Exposed portions of p-n junction 14 of element 11 are fully enclosed and protected within annular cavity 20 formed by the structure. Assembly of the component parts of the structure, that is plated element 11, nail head electrode 16, disc 19, and plated ring 17, can be made in one simple heating step wherein fusion of disc 19 and electrode 16 with gold platings 18 and 15 forms a gas tight seal over trench or groove 13 and around mesa 12. Sealing of the device is conveniently carried out in an atmosphere which will protect the junctions and other environment sensitive portions of element 11. This atmosphere is thus sealed within cavity 20, protecting exposed portions of junction 14, stabilizing the characteristics of element 11.

The term "exposed," as applied to junctions or portions thereof, is to be understood as referring to portions of junctions not wholly within the semiconductor body itself. For example, junctions are "exposed" if they intersect a surface of the semiconductor element. Such exposed junctions may, however, have applied thereover protective films of some substance other than that of which the semielectrode strips 53 to be of, or contain, a p-type dopant for silicon, such as aluminum. The other of strips 53 may be of a material having no doping effect on silicon, for example platinum, or one having an n-type doping action, such as gold, so that semiconductor element 54 retains its initial n-type character unchanged under said second strip. In such an arrangement, the first of the electrodes forms the emitter connection, the second the base connection. Additionally, for transistor action, the element 54 will include another p-n junction, typically in the mesa parallel to and underlying the face to which strips 53 connect. This junction is formed as a separate operation, typically by vapor-solid diffusion, before the element is encapsulated.

Figure 3:
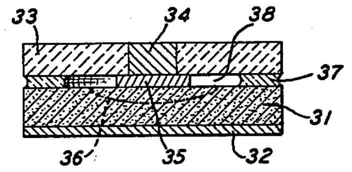
FIG. 3 is a front elevation, in section, of a second type of self-encapsulated semiconductor diode much enlarged.
Figure 4:
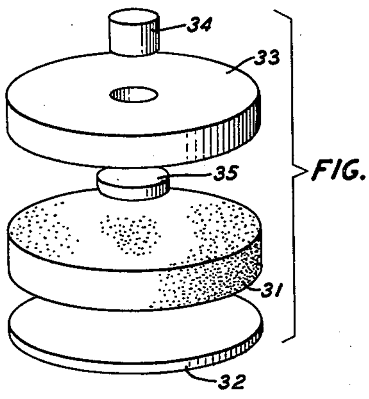
FIG. 4 is an exploded perspective view of the device in FIG. 3 showing its component members.

Strips 53 may be foil strips mounted on the underside of disk 51, or thin coatings bonded to disk 51 by evaporating, sputtering, or similar techniques. It is convenient to preassemble disk 51, electrode numbers 52 and strips 53 into a unit; and then to complete the device by sealing this unit to semiconductor element 54 having coating 55 thereon. Sealing of the structure to protect exposed electrically active portions of junction 56 is by a peripheral ring of glass composition 57, conveniently fused to form a seal during a firing operation which also bonds electrode strips 53 to element 54 and accomplishes diffusion doping, when desired. As mentioned for the device shown in FIGS. 3 and 4, a metal sealing washer may be used rather than glass 57 to join the component subassemblies and seal off the portions of the device sensitive to environmental change within cavity 58.

Figure 5:
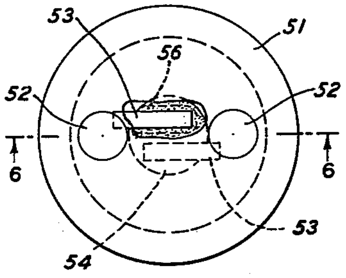
FIG. 5 is a plan elevation of a triode device, much enlarged, having a self-encapsulated semiconducting element.
Figure 6:
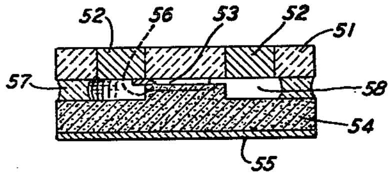
FIG. 6 is a side elevation of the device shown in FIG. 5, in section, taken along line 6—6 of FIG. 5.
Figure 7:
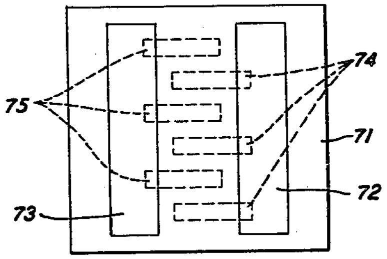
FIG. 7 is a plan elevation of a multiple electrode protective member, much enlarged, which can be used in semiconductor devices modified from the type shown in FIGS. 5 and 6.

In FIG. 7 is shown a plan elevation of a cover subassembly for semiconducting devices. The protective cover is a modified design of that shown as disk 51 in FIGS. 5 and 6 in having multiple electrodes. The modified cover comprises a non-conducting wafer 71, such as of a ceramic composition, having conducting terminal members 72, 73 tightly sealed on their periphery to wafer 71, and extending therethrough from top to bottom. As in the example shown in FIGS. 5 and 6 and described earlier herein, conducting electrode strips of foil or thin coats of metal 74 and 75 bonded to the underface of wafer 71, are in electrical contact with terminal members 72 and 73. One set 74 of such electrode strips, in contact with member 72, provides a set of electrical paths from a semiconductor element (not shown) with which they may be in intimate contact to member 72, which may be connected in an external circuit as one terminal of a semiconductor device. Second set 75 of strips alternately aligned with those of set 74 is in common contact with terminal member 73, acting as a second multiple electrode. Both sets 74 and 75 of strips may be made of the same conducting metal, such as platinum, or one set thereof may perform a doping function to originate a certain conductivity type region in the semiconductor material to which they are bonded. Bonding to an underlying semiconductor element, accomplished by heating, may then also bring about diffusion of doping impurities. Exemplary of, and particularly convenient for this process, is the use of aluminum or aluminum alloys as the material from which to make one set of strips 72 or 73. A multiple electrode assembly as shown in FIG. 7 is particularly useful for use in high power devices carrying a heavy load.

Cover 71 of FIG. 7 has been shown as having square geometry because such is particularly convenient for a rectangular arrangement of multiple electrodes as shown in FIG. 7. In FIG. 7, and in the other FIGS. 1 through 6, 8 and 9, it is to be understood that whether the wafers shown are circular, square, or take another planar form is not critical to the principles of self-encapsulation. Further, though wafers are shown and are a convenient and conventional form for semiconductor devices, other three-dimensional forms are equally acceptable. Such forms may be greater in their vertical than in their horizontal dimensions and thus be cylindrical or have an elongated prismatic form for example.

Figure 8:
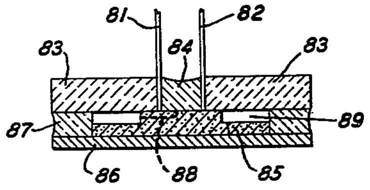
FIG. 8 is a side elevation, in section, of another variety of self-encapsulated semiconductor triode device, much enlarged, having foil electrodes.
Figure 9:
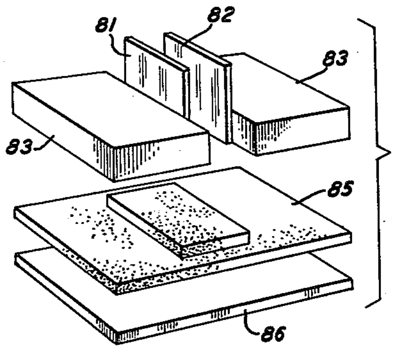
FIG. 9 is an exploded perspective view of the device shown in FIG. 8 showing the component members thereof.

In FIGS. 8 and 9 are shown, respectively, a front elevation, in section, and an exploded perspective view of still another device, a semiconductor triode having foil electrodes. Electrodes 81 and 82 are of a thin metallic foil, joined on a face thereof to blocks 83 of a non-conducting material, for example conveniently of a high alumina ceramic or a glass. Insulating glass composition 84 (not shown in FIG. 9), similar to those already described herein, physically separates and electrically isolates one electrode from the other, and helps support both. Edge portions of electrodes 81 and 82 are in electrical contact with a raised portion of semiconductor member 85, which is in turn bonded on its underface to metal wafer 86, serving as a third electrode and a surface for dissipating heat generated by operation of the device. Ceramic blocks 83 are joined to metal wafer 86 by a peripheral ring of glassy composition 87 (not shown in FIG. 9), forming cavity 89 in which exposed electrically active portions of semiconductor wafer 85 are sealed from the external environment.

Such an electrically active portion is p-n junction 88 (not shown in FIG. 9), conveniently formed during assembly of the device by diffusion of significant impurities into semiconductor element 85 during the heating incident to assembly. This technique has been described earlier as one particularly advantageous, since by formation of regions of differing semiconductivity types during the very step of affixing electrodes, problems of registration of the electrodes with priorly doped regions is obviated.

For assembly of the device shown in FIGS. 8 and 9 it is convenient to preassmble the upper electrode portion comprising ceramic blocks 83, electrodes 81 and 82, and glass composition 84. The finished subassembly, semiconductor element 85, which has been prefabricated to have a raised mesa, and metal wafer 86 are then sandwiched and heated at a temperature sufficient to fuse semiconductor element 85 to metal wafer 86 (for example of molybdenum), and to fuse electrodes 81 and 82 to element 85. By heating for a period longer than that just necessary to fuse electrodes 81 and 82, diffusion of doping agents from the electrodes into semiconductor element 85 can be brought about. In the device of FIGS. 8 and 9, for example, semiconductor element 85 may be initially of n-type silicon, electrode 81 of a molybdenum-arsensic alloy and electrode 82 of pure molybdenum. Arsenic diffused from the alloy of electrode 81 creates a p-type region in the n-type semiconductor element beneath electrode 81, forming p-n junction 88. Glass seal 87 is also formed during the heating, conveniently by fusion of powdered glass distributed on peripheral portions of element 85 before firing. The powder is conveniently applied to the periphery of semiconductor element 85 in a volatile adhesive base, such as "Acryloid A–10," a solution of 30 percent polymethylmethacrylate solids in "Cellosolve Acetate" (ethylene glycol monoethyl ether acetate).

The use of foils as electrodes, as in the device shown in FIGS. 8 and 9, has the advantage of achieving an optimum configuration for electrodes, with uniform spacing of the foil edges being easily achieved over the entire length of contact with the semiconducting element. When the electrodes are also used to dope regions of the semiconductor, forming the essential p-n junctions, problems of registration of the electrodes with variously doped regions of the semiconductor element are eliminated, as mentioned earlier.

Although specific embodiments have been shown and described, it is to be understood they are merely illustrative and are not limiting on the scope and spirit of the invention. In particular, in many instances, it may be advantageous to make the geometry of the self-encapsulated device such that it can be used as a plug-in element in a printed circuit or modular arrangement.

What is claimed is:

1. A semiconductor device having a layered structure, said device comprising a silicon wafer having exposed p-n junctions in central portions of one face thereof, an insulating protective member comprising a ceramic wafer having electrode means centrally disposed therein, said protective member and said silicon wafer being opposed, and joined peripherally and centrally with said electrode means in electrical contact with central portions of said face of said silicon wafer, whereby between opposed central and peripheral portions of said silicon wafer and said protective member an enclosure for exposed p-n junctions of said silicon wafer is defined.

2. A semiconductor device having a layered structure, said device comprising a silicon wafer having a raised central portion including regions of different semiconductor conductivity type and exposed p-n junctions therebetween, and a ceramic insulating protective wafer having electrode means sealed therethrough, said ceramic wafer being joined in its center and on its periphery to said silicon wafer with said electrode means in electrical contact with said raised central portion of said silicon wafer, whereby said exposed p-n junctions are sealed within a central annular cavity isolated from the external atmosphere.

3. A semiconductor device having a layered structure, said device comprising a metal wafer as one layer, a silicon wafer having exposed p-n junctions joined thereto as a center layer, and an insulating ceramic wafer having electrode means in contact with said silicon wafer as a third layer, said ceramic wafer and silicon wafer being held apart in a spaced relationship by said electrode means in contact with said silicon wafter and by a peripheral seal bonding said ceramic and silicon wafers, whereby a sealed cavity protecting said exposed p-n junctions is defined.

4. A semiconductor device having a layered structure, said device comprising a gold plated silicon wafer predominantly of a single semiconductor conductivity type, said wafer having a closed continuous unplated groove in one face thereof, said groove isolating in said face a central region of semiconductor conductivity type different from the predominant conductivity type of said wafer and exposing an electrically active junction between said different conductivity types, an annular gold washer joined to said plated silicon wafer on those portions of said wafer peripheral to said groove, a central gold electrode joined to said central region of said plated silicon wafer, and an annular ceramic wafer joined to said annular gold washer and said central electrode, whereby a central annular cavity inclusive of said exposed electrically active junction is formed.

5. A semiconductor device having a layered structure, said device comprising a metal electrode wafer, a protective member, and a silicon wafer therebetween, said silicon wafer having on that face opposing said protective member a raised central portion having regions of different semiconductor conductivity type therein and exposed electrically active junctions between said regions of different conductivity type, said protective member comprising a pair of edge-opposed insulating ceramic wafers, a pair of metal foil electrodes in electrical contact with said raised central portion of said silicon wafer, and an insulating glassy composition between said foils and ceramic wafers, said protective member, further, being peripherally sealed with an insulating glassy composition to said silicon wafer and said metal electrode wafer, whereby a sealed cavity inclusive of said exposed electrically active junctions is formed.

6. The method of fabricating a semiconductor device having a layered structure, which method consists of forming a sealed cavity inclusive of exposed electrically active junctions between regions of different semiconductivity type in a semiconductor element by peripherally bonding in a spaced relationship a face of said semiconductor element including such exposed junctions with a lamellate insulating protective member having electrode means, leaving a separation between said face and said protective member in non-peripheral portions, whereby said sealed cavity is formed.

7. The method of fabricating a semiconductor device, which method consists of forming a layered structure by opposing one face of a semiconductor element having exposed electrically active junctions thereon with a lamellate insulating protective member having electrode means, and bonding in a spaced relationship said opposed face and said protective member on their common periphery with said electrode means in contact with said face, whereby a sealed cavity inclusive of said exposed electrically active junctions is formed.

8. The method of fabricating a semiconductor device, which method consists of sealing a metal electrode wafer to one face of a silicon wafer having exposed p-n junctions on its second face, and then peripherally sealing in a spaced relationship said second face of said silicon wafer to an insulating wafer having electrode means in electrical contact with said second face of said silicon wafer, whereby a sealed cavity inclusive of said exposed p-n junctions is formed.

9. A semiconductor device having a layered structure, said device comprising a semiconductor wafer having an exposed p-n junction in at least one raised portion of one face thereof, an insulating protective member comprising a ceramic wafer having electrode means disposed thereon, said protective member and said semiconductor wafer being opposed, and joined peripherally, with said electrode means being in electrical contact with said raised portion for forming between said semiconductor wafer and said protective member an enclosed space for said exposed p-n junction.

10. A semiconductor device having a layered structure, said device comprising a semiconductor wafer having exposed p-n junctions in central portions of one face thereof, an insulating protective member comprising a ceramic wafer having electrode means centrally disposed therein, said protective member and said semiconductor wafer being opposed, and joined peripherally and centrally with said electrode means in electrical contact with central portions of said face of said semiconductor wafer, whereby between opposed central and peripheral portions of said semiconductor wafer and said protective member an enclosed space for exposed p-n junctions of said semiconductor wafer is defined.

References Cited in the file of this patent

UNITED STATES PATENTS

| | | |
|---|---|---|
| 2,736,847 | Barnes | Feb. 28, 1956 |
| 2,874,340 | Lehovec | Feb. 17, 1959 |
| 2,887,628 | Zierdt | May 19, 1959 |
| 2,891,160 | Leblond | June 16, 1959 |
| 2,946,935 | Finn | July 26, 1960 |
| 2,959,718 | Kadelburg et al. | Nov. 8, 1960 |